US 6,576,930 B2

(12) United States Patent
Reeh et al.

(10) Patent No.: US 6,576,930 B2
(45) Date of Patent: Jun. 10, 2003

(54) LIGHT-RADIATING SEMICONDUCTOR COMPONENT WITH A LUMINESCENCE CONVERSION ELEMENT

(75) Inventors: Ulrike Reeh, München (DE); Klaus Höhn, Taufkirchen (DE); Norbert Stath, Regensburg (DE); Günter Waitl, Regensburg (DE); Peter Schlotter, Freiburg (DE); Jürgen Schneider, Kirchzarten (DE); Ralf Schmidt, Vörstetten (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 09/731,452

(22) Filed: Dec. 7, 2000

(65) Prior Publication Data

US 2001/0002049 A1 May 31, 2001

Related U.S. Application Data

(62) Division of application No. 09/221,789, filed on Dec. 28, 1998, which is a continuation of application No. PCT/DE97/01337, filed on Jun. 26, 1997.

(30) Foreign Application Priority Data

Jun. 26, 1996 (DE) .......................... 196 25 622
Sep. 20, 1996 (DE) .......................... 196 38 667

(51) Int. Cl.[7] .............................................. H01L 33/00
(52) U.S. Cl. ........................... 257/98; 257/99; 257/100
(58) Field of Search ............................ 257/98, 99, 100

(56) References Cited

U.S. PATENT DOCUMENTS

| 2,096,693 A | 10/1937 | Cox | 313/485 |
|---|---|---|---|
| 2,192,869 A | 3/1940 | Pearce | 313/485 |
| 3,593,055 A | 7/1971 | Geusie | 257/98 |
| 3,602,758 A | 8/1971 | Thornton | 313/485 |
| 3,691,482 A | 9/1972 | Pinnow | 330/108 |

(List continued on next page.)

FOREIGN PATENT DOCUMENTS

| DE | 2 347 289 | 4/1974 |
| DE | 33 15 675 A1 | 11/1983 |
| DE | 38 04 293 A1 | 8/1989 |
| EP | 0 486 052 A1 | 5/1992 |
| EP | 97 933 047.9 | 7/1997 |
| JP | 46-7462 | 12/1971 |

(List continued on next page.)

OTHER PUBLICATIONS

English Translation of Japanese 01175103 A, Jul. 11, 1989.
English Translation of Japanese 01260707 A, Oct. 18, 1989.
Phosphor Handbook, English Translation of (BAT).
"Phosphor Handbook", Ohm 1987, pp. 172–174, 188–189, 270, 275–276, 383–385.
Nakamura, Shuji et al., Candela–class high–brightness InGan/AlGaN double–heterostructure blue–light–emitting diodes, App. Phys. Lett 64 (13) Mar. 28, 1994, pp. 1687–1689.

(List continued on next page.)

Primary Examiner—Jerome Jackson
(74) Attorney, Agent, or Firm—Fish & Richardson P.C.

(57) ABSTRACT

The light-radiating semiconductor component has a radiation-emitting semiconductor body and a luminescence conversion element. The semiconductor body emits radiation in the ultraviolet, blue and/or green spectral region and the luminescence conversion element converts a portion of the radiation into radiation of a longer wavelength. This makes it possible to produce light-emitting diodes which radiate polychromatic light, in particular white light, with only a single light-emitting semiconductor body. A particularly preferred luminescence conversion dye is YAG:Ce.

4 Claims, 6 Drawing Sheets

U.S. PATENT DOCUMENTS

| | | | |
|---|---|---|---|
| 3,696,478 A | 10/1972 | Pinnow et al. | |
| 3,819,974 A | 6/1974 | Stevenson et al. | |
| 3,932,881 A | 1/1976 | Mita et al. | 257/98 |
| 5,019,746 A | 5/1991 | Merg | |
| 5,126,214 A | 6/1992 | Tokailin | 313/503 |
| 5,535,230 A | 7/1996 | Abe | 257/98 |
| 5,959,316 A | 9/1999 | Lowery | 257/98 |
| 5,998,925 A | 12/1999 | Shimizu et al. | |
| 6,069,440 A | 5/2000 | Shimizu et al. | 313/486 |

FOREIGN PATENT DOCUMENTS

| | | |
|---|---|---|
| JP | 50-43913 | 4/1975 |
| JP | 52-40959 | 10/1977 |
| JP | 2-91980 | 9/1988 |
| JP | 5-152609 | 6/1993 |
| JP | 6-69546 | 3/1994 |
| JP | 7-99345 | 4/1995 |
| JP | 7-176794 | 7/1995 |
| JP | 198585/1996 | 7/1996 |
| JP | 244339/1996 | 9/1996 |
| JP | 245381/1996 | 9/1996 |
| JP | 359004/1996 | 12/1996 |
| JP | 9-73807 | 3/1997 |
| JP | 081010/1997 | 3/1997 |
| JP | 11-220174 | 8/1999 |

OTHER PUBLICATIONS

Nakamuri, T, "Nichia Chemical starts the sample shipment of white light Emitting Diode", Nikkei Electronics, Sep. 23, 1996 (No. 671), pp. 15–16.
English translation of (BAV).
Schlotter, P. et al., "Luminescence conversion of blue light emitting diodes", Applied Physics A, Springer Verlag (publ.), Apr. 1997, vol. 4, pp. 417–418.
Material Safety Data Sheet, pp. 1 and 2, and Lamp Phosphor Data Sheet of Phosphor NP–204 of Nichia Corporation.
"Phosphor and Emitter", Osram GmbH, Jun. 1997.
Proceedings of 264th Institute of Phosphor Society, "Development and Application of high bright white LED Lamps", Nov. 29, 1996, pp. 5–14.
English Translation of (BAAA).
English Translation of Japanese Patent Application No. 245381, Filed Sep. 18, 1996, Nichia Chemical Industries Ltd.
English Translation of Japanese Patent Application No. 359004, Filed Dec. 27, 1996, Nichia Chemical Industries Ltd.
English Translation of Japanese Patent Application No. 198585, Filed Jul. 29, 1996, Nichia Chemical Industries Ltd.
English Translation of Japanese Patent Application No. 018010, Filed Mar. 31, 1997, Nichia Chemical Industries Ltd.
Nikkei Sangyo Shimbun (Nikkei Industrial Newspaper), Sep. 13, 1996.
English Abstract of Japanese 7–99345, Apr. 11, 1995.
B.M. J. Smets, "Phosphors Based On Rare–Earths, A New Era in Fluorescent Lighting", Materials Chemistry and Physics, 16 (1987), pp. 283–299.
Chao et al., *Jour Solid State Chemistry*, "White Light Emitting Glass", p. 17–29.
D.J. Robbins, "The Effects of Crystal Field and Temperature on the Photoluminescence Excitation of $Ce^{3+}$ in YAG", J. Electrochem. Soc.; Solid State Science and Technology, Sep. 1979, vol. 126, No. 9, pp. 1550–1555.
Frank Möllmer et al., "Siemens SMT–TOPLED für die Oberflächenmontage", [Siemens SMT–TOPLEDS for surface mounting], Siemens Components 29, 1991, No. 4, pp. 147–149.
G. Blasse et al., "A New Phosphor For Flying–Spot Ray Tubes For Color Television; Yellow–Emitting $Y_3Al_5O_{12}Ce^{3+}$", Applied Physics Letter, vol. 11, No. 2, Jul. 15, 1967, pp. 53, 54.
German Utility Model G 90 12 615.2., dated Jan. 24, 1991, electroluminescent or laser diode.
Glen A. Slack et al., "Optical Absorption of $Y_3Al_5O_{12}$ from 10–to 55000–$cm^{-1}$ Wave Numbers", Physical review, vol. 177, No. 3, Jan. 15, 1969, pp. 1308–1314.
Japanese Patent Abstract 07176794 A (Yoshinori), dated Jul. 14, 1995.
Japanese Patent Abstract 08007614 (Yoshinori), dated Jan. 12, 1996.
Japanese Patent Abstract No. 5–152609 (Tdatatsu), dated Jun. 18, 1993.
Mary V. Hoffman, "Improved color rendition in high pressure mercury vapor lamps", Journal of IES, Jan. 1977, pp. 89–91.
S.N. Mohammad et al., "Emerging Gallium Nitride Based Devices", Proceedings of the IEEE, vol. 83, No. 10, Oct. 1995, pp. 1306–1355.
Sato et al., "Full–Color . . . Diode", Jpn. J. Appl. Phys., vol. 24 (1996), pp. L838–L839, 7/96.
Shuji Nakamura et al., "The blue laser diode; GaN based light emitters and lasers", Springer Verlag, Berlin, 1997, 99. 216–219, 328.
Siemens Forsch.–u. Entwickl.–Ber Bd 5 (1977) No. 3, p. 162 [Siemens research and development reports, vol., 6].
Thomas Jüstel et al., "Neue Entwicklungen auf dm Gebiet luminiszierender Materialien für Beleuchtungs–und Displayanwendungen" [new developments in the field of luminescent material for lighting and display applications], Angew. Chem., 1998, 110, pp. 3250–3271.
White LED Lamp by Nichia, copy of a Japanese Newspaper, dated Sep. 1996.

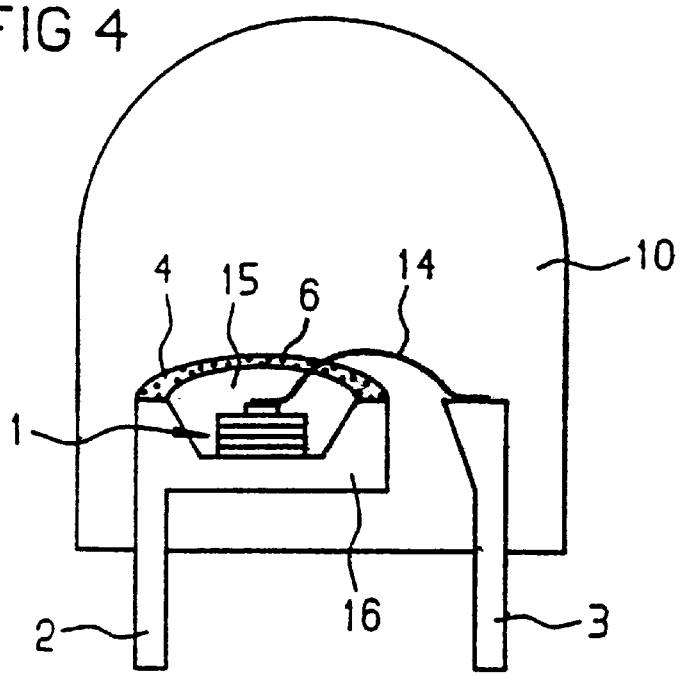
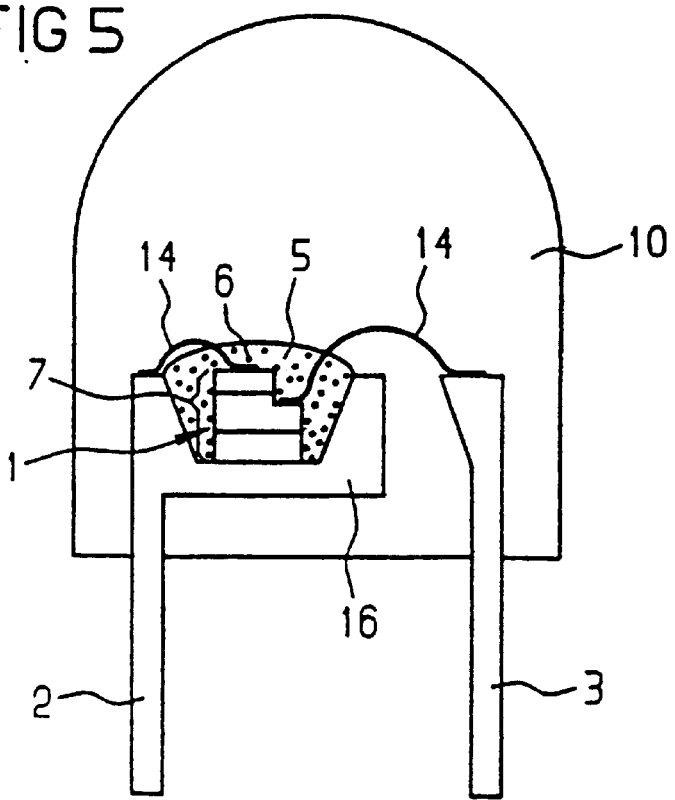

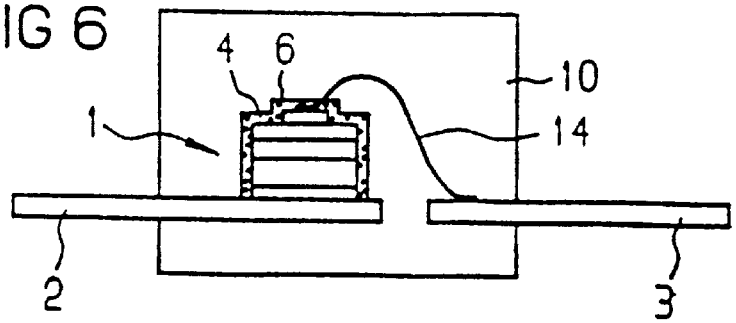
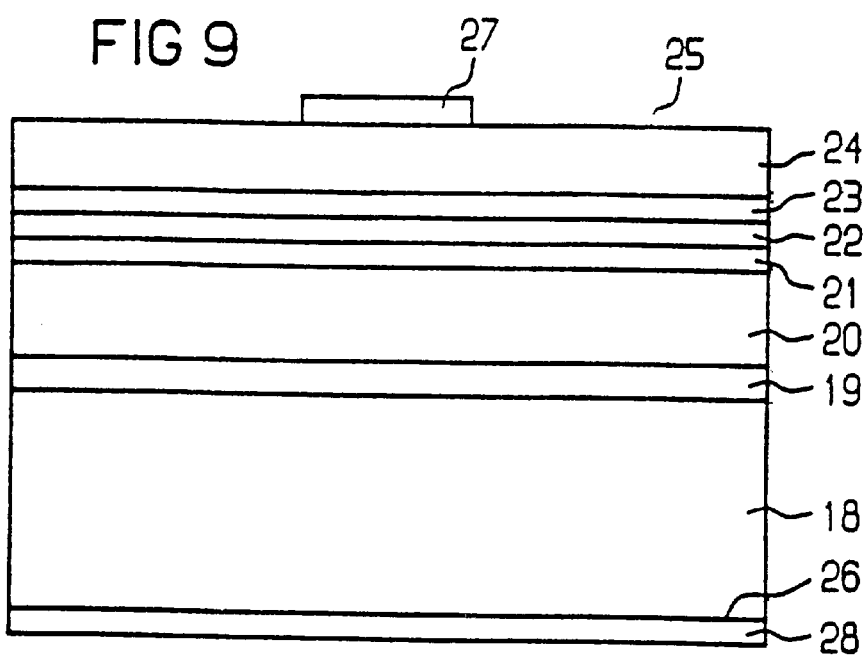
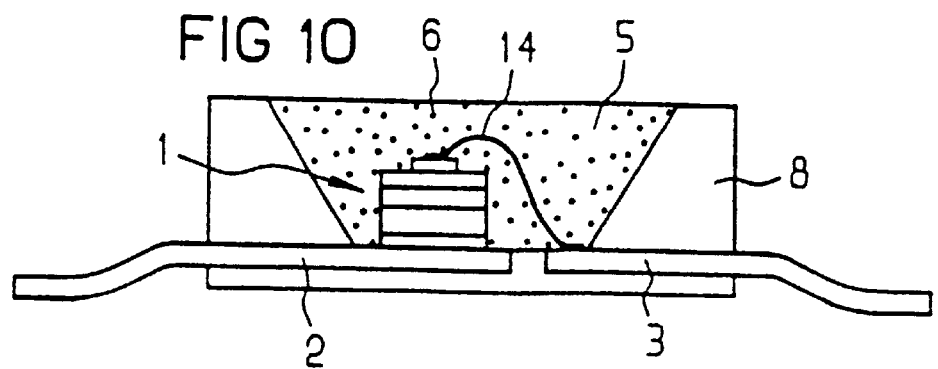

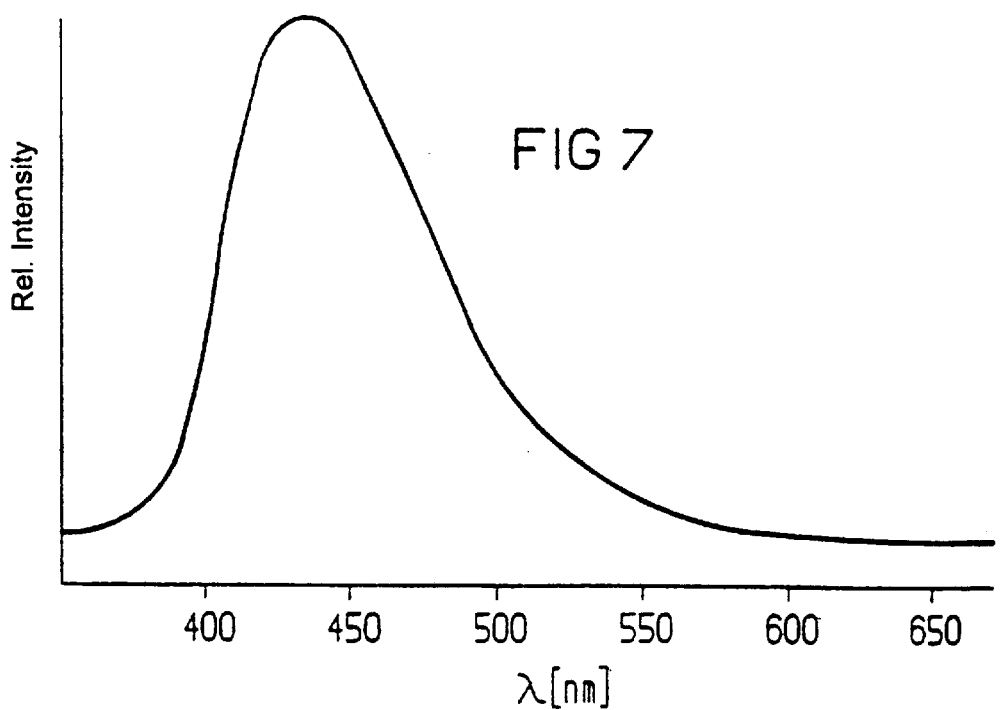
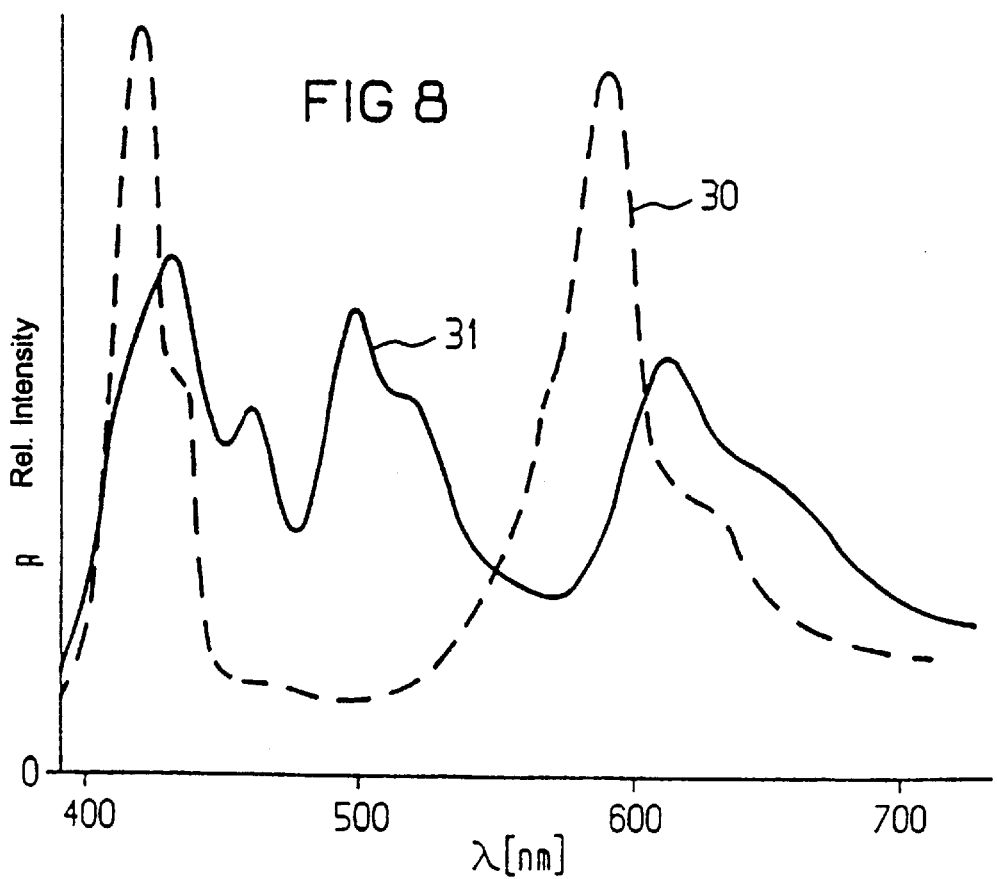

LIGHT-RADIATING SEMICONDUCTOR COMPONENT WITH A LUMINESCENCE CONVERSION ELEMENT

CROSS-REFERENCE TO RELATED APPLICATION

This is a divisional of U.S. application Ser. No. 09/221,789, filed Dec. 28, 1998, which is a continuation of International Application PCT/DE97/01337, filed Jun. 26, 1997, which designated the United States.

BACKGROUND OF THE INVENTION

Field of the Invention

The invention relates to a light-radiating semiconductor component with a semiconductor body that emits electromagnetic radiation during operation of the semiconductor component. The component has at least one first and at least one second electrical terminal, which are electrically connected to the semiconductor body. The component further has a luminescence conversion element with at least one luminescent material.

A semiconductor component of that type is disclosed, for example, in German published patent application DE 38 04 293. There, an arrangement having an electroluminescent or laser diode in which the entire emission spectrum radiated by the diode is shifted toward greater wavelengths by means of a plastic element that is treated with a fluorescent, light-converting organic dye. The light radiated by the arrangement consequently has a different color from the light emitted by the light-emitting diode. Depending on the nature of the dye added to the plastic, light-emitting diode arrangements which emit light in different colors can be produced using one and the same type of light-emitting diode.

German published patent application DE 23 47 289 discloses an infrared (IR) solid-state lamp in which luminescent material is applied on the edge of an IR diode and converts the IR radiation that is radiated there into visible light. The aim of this measure is, for supervisory purposes, to convert a smallest possible part of the IR radiation emitted by the diode into visible light in conjunction with the smallest possible reduction of the intensity of the emitted IR radiation.

Furthermore, European patent application EP 486 052 discloses a light-emitting diode in which at least one semiconductor photoluminescent layer is arranged between the substrate and an active electroluminescent layer. The semiconductor photoluminescent layer converts the light of a first wavelength range—the light emitted by the active layer in the direction of the substrate—into light of a second wavelength range, with the result that, altogether, the light-emitting diode emits light of different wavelength ranges.

In many potential areas of application for light-emitting diodes, such as, for example, in display elements in motor vehicle dashboards, lighting in aircraft and automobiles, and in full-color LED displays, there is increasingly a demand for light-emitting diode arrangements with which polychromatic light, in particular white light, can be produced.

Japanese patent application JP-07 176 794-A describes a white-light-emitting, planar light source in which two blue-light-emitting diodes are arranged at an end of a transparent plate. The diodes emit light into the transparent plate. The transparent plate is coated with a fluorescent substance on one of the two mutually opposite main surfaces. The fluorescent substance emits light when it is excited by the blue light of the diodes. The light emitted by the fluorescent substance has a different wavelength from that of the blue light emitted by the diodes. In that prior art component, it is particularly difficult to apply the fluorescent substance in such a manner that the light source radiates homogeneous white light. Furthermore, the question of reproducibility in mass production also poses major problems because even slight fluctuations in the thickness of the fluorescent layer, for example on account of unevenness of the surface of the transparent plate, cause a change in the shade of white of the radiated light.

SUMMARY OF THE INVENTION

It is accordingly an object of the invention to provide a light-radiating semiconductor component, which overcomes the above-mentioned disadvantages of the heretofore-known devices and methods of this general type and which radiates homogeneous polychromatic light and ensures technically simple mass production with component characteristics that are reproducible to the greatest possible extent.

With the foregoing and other objects in view there is provided, in accordance with the invention, a light-radiating semiconductor component, comprising:

a semiconductor body emitting electromagnetic radiation during an operation of the semiconductor component, the semiconductor body having a semiconductor layer sequence suitable for emitting electromagnetic radiation of a first wavelength range selected from a spectral region consisting of ultraviolet, blue, and green;

a first electrical terminal and a second electrical terminal each electrically conductively connected to the semiconductor body; and a luminescence conversion element with at least one luminescent material, the luminescence conversion element converting a radiation originating in the first wavelength range into radiation of a second wavelength range different from the first wavelength range, such that the semiconductor component emits polychromatic radiation comprising radiation of the first wavelength range and radiation of the second wavelength range.

The invention provides for the radiation-emitting semiconductor body to have a layer sequence, in particular a layer sequence with an active semiconductor layer made of $Ga_xIn_{1-x}N$ or $Ga_xAl_{1-x}N$, which emits an electromagnetic radiation of a first wavelength range from the ultraviolet, blue and/or green spectral region during operation of the semiconductor component. The luminescence conversion element converts part of the radiation originating from the first wavelength range into radiation of a second wavelength range, in such a way that the semiconductor component emits polychromatic radiation, in particular polychromatic light, comprising radiation of the first wavelength range and radiation of the second wavelength range. This means, for example, that the luminescence conversion element spectrally selectively absorbs part of the radiation emitted by the semiconductor body, preferably only over a spectral subregion of the first wavelength range, and emits it in the region of longer wavelength (in the second wavelength range). Preferably, the radiation emitted by the semiconductor body has a relative intensity maximum at a wavelength $\lambda \leq 520$ nm and the wavelength range which is spectrally selectively absorbed by the luminescence conversion element lies outside this intensity maximum.

In accordance with an added feature of the invention, the luminescence conversion element converts radiation of the first wavelength range into radiation of a plurality of second wavelength ranges from mutually different spectral subregions, such that the semiconductor component emits polychromatic radiation comprising radiation of the first wavelength range and radiation of the plurality of second wavelength ranges. In other words, the invention advantageously makes it possible also to convert a number (one or more) of first spectral subregions originating from the first wavelength range into a plurality of second wavelength ranges. As a result, it is possible to produce diverse color mixtures and color temperatures.

The semiconductor component according to the invention has the particular advantage that the wavelength spectrum generated by way of luminescence conversion and hence the color of the radiated light do not depend on the level of the operating current intensity through the semiconductor body. This has great significance particularly when the ambient temperature of the semiconductor component and, consequently, as is known, also the operating current intensity greatly fluctuate. Especially light-emitting diodes having a semiconductor body based on GaN are very sensitive in this respect.

In addition, the semiconductor component according to the invention requires only a single driving voltage and, as a result, also only a single driving circuit configuration, whereby the outlay on devices for the driving circuit of the semiconductor component can be kept very low.

In accordance with an additional feature of the invention, the semiconductor component has a defined main radiating direction, and the luminescence conversion element is disposed substantially downstream of the semiconductor body in the main radiating direction of the semiconductor component.

In accordance with another feature of the invention, the luminescence conversion element is at least one luminescence conversion layer disposed in a vicinity of the semiconductor body. In this particularly preferred embodiment of the invention, a partially transparent luminescence conversion layer, that is to say one which is partially transparent to the radiation emitted by the radiation-emitting semiconductor body, is provided as the luminescence conversion element above or on the semiconductor body. In order to ensure a uniform color of the radiated light, the luminescence conversion layer is advantageously designed in such a way that it has a constant thickness throughout. This has the particular advantage that the path length of the light radiated by the semiconductor body through the luminescence conversion layer is virtually constant for all radiation directions. The effect that can be achieved as a result of this is that the semiconductor component radiates light of the same color in all directions. A further particular advantage of a semiconductor component according to the invention in accordance with this development consists in the fact that a high degree of reproducibility can be obtained in a simple manner, which is of considerable significance for efficient mass production. A resist or resin layer treated with luminescent material may be provided, for example, as the luminescence conversion layer.

In accordance with a further feature of the invention, the luminescence conversion element is a luminescence conversion encapsulation enclosing at least a part of the semiconductor body and partial regions of the first and second electrical terminals. The encapsulation is partially transparent and encloses at least part of the semiconductor body (and possibly partial regions of the electrical terminals) and can simultaneously be utilized as component encapsulation (housing). The advantage of a semiconductor component in accordance with this embodiment consists essentially in the fact that conventional production lines used for the production of conventional light-emitting diodes (for example radial light-emitting diodes) can be utilized for its production. The material of the luminescence conversion encapsulation is used for the component encapsulation instead of the transparent plastic which is used for this purpose in conventional light-emitting diodes.

In further advantageous embodiments of the semiconductor component according to the invention and of the two preferred embodiments mentioned above, the luminescence conversion layer or the luminescence conversion encapsulation is composed of a transparent material, for example plastic, preferably epoxy resin, which is provided with at least one luminescent material (examples of preferred plastics and luminescent materials will be found further below). In this way, it is possible to produce luminescence conversion elements in a particularly cost-effective manner. Specifically, the requisite process steps can be integrated in conventional production lines for light-emitting diodes with no major outlay.

In accordance with again an added feature of the invention, the second wavelength range includes wavelengths at least some of which are longer than wavelengths of the first wavelength range.

In accordance with again an additional feature of the invention, the semiconductor body is adapted to emit ultraviolet radiation during operation of the semiconductor component, and the luminescence conversion element converts at least a portion of the ultraviolet radiation into visible light.

In accordance with again another feature of the invention, the first wavelength range and the second wavelength range of the polychromatic radiation lie at least partially in mutually complementary-color spectral regions, and a combination of radiation from the first and second wavelength range results in white light.

When the second spectral subregion of the first wavelength range and a second wavelength range are complementary to one another, it is possible to produce polychromatic, in particular white, light from a single colored light source, in particular a light-emitting diode having a single blue-light-radiating semiconductor body. In order, for example, to produce white light with a blue-light-emitting semiconductor body, part of the radiation from the blue spectral region emitted by the semiconductor body is converted into the yellow spectral region, which is complementarily colored with respect to blue. The color temperature or color locus of the white light can in this case be varied by a suitable choice of the luminescence conversion element, in particular by a suitable choice of the luminescent material, its particle size and its concentration. Furthermore, these arrangements also advantageously afford the possibility of using luminescent material mixtures, as a result of which, advantageously, the desired hue can be set very accurately. Likewise, it is possible to configure luminescence conversion elements inhomogeneously, for example by means of inhomogeneous luminescent material distribution. Different path lengths of the light through the luminescence conversion element can advantageously be compensated for as a result of this.

In accordance with again a further feature of the invention, the first wavelength range emitted by the semiconductor body and two second wavelength ranges produce an additive color triad, such that white light is radiated by the semiconductor component during operation thereof.

In a further preferred embodiment of the semiconductor component according to the invention, the luminescence conversion element or another constituent of a component encapsulation has, for the purpose of color matching, one or more dyes which do not effect wavelength conversion. For this purpose, it is possible to use the dyes which are used for the production of conventional light-emitting diodes, such as, for example, azo, anthraquinone or perinone dyes.

In order to protect the luminescence conversion element against an excessively high radiation load, in an advantageous development or in the above-mentioned preferred embodiments of the semiconductor component according to the invention, at least part of the surface of the semiconductor body is surrounded by a first, transparent casing composed, for example, of a plastic, on which casing the luminescence conversion layer is applied. This reduces the radiation density in the luminescence conversion element and, consequently, the radiation load thereof, which, depending on the materials used, has a positive effect on the life of the luminescence conversion element.

In accordance with yet an added feature of the invention, the radiation emitted by the semiconductor body has a luminescence intensity maximum in a blue spectral region at a wavelength selected from the group consisting of $\lambda=430$ nm and $\lambda=450$ nm. The preferred radiation-emitting semiconductor body has a radiation spectrum with an intensity maximum at a wavelength of between 420 nm and 460 nm, in particular at 430 nm (for example semiconductor body based on $Ga_xAl_{1-x}N$) or 450 nm (for example semiconductor body based on $Ga_xIn_{1-x}N$). It is advantageous that virtually all colors and mixed colors of the C.I.E. chromaticity diagram can be produced by such a semiconductor component according to the invention. In this case, as specified above, the radiation-emitting semiconductor body may essentially be composed of electroluminescent semiconductor material, but also of a different electroluminescent material, such as polymer material, for example.

In accordance with yet an additional feature of the invention, an opaque base housing is formed with a recess, and wherein the semiconductor body is disposed in the recess of the base housing, and including a covering layer having a luminescence conversion layer on the recess. Alternatively, the recess is at least partially filled with the luminescence conversion element.

In accordance with yet another feature of the invention, the luminescence conversion element comprises a plurality of layers with mutually different wavelength conversion properties.

In accordance with yet a further feature of the invention, the luminescence conversion element includes organic dye molecules in a plastic matrix, such as in a matrix of silicone, thermoplastic material, or thermosetting plastic material. The luminescence conversion element may also have organic dye molecules in an epoxy resin matrix or a polymethyl methacrylate matrix.

In accordance with yet again an added feature of the invention, the luminescence conversion element has at least one inorganic luminescence material selected from the group of phosphors. The inorganic luminescent material is preferably from the group of Ce-doped garnets, such as YAG:Ce.

In accordance with yet again an additional feature of the invention, the inorganic luminescent material is embedded in an epoxy resin matrix. It may also be embedded in a matrix formed of inorganic glass with a relatively low melting point.

Preferably, the inorganic luminescent material has a mean particle size of approximately 10 $\mu$m.

In accordance with yet again another feature of the invention, the luminescence conversion element is provided with a plurality of mutually different materials selected from the group consisting of organic and inorganic luminescent materials. The luminescence conversion element may include organic or inorganic dye molecules partly with and partly without a wavelength conversion effect.

In accordance with yet again a further feature of the invention, the luminescence conversion element includes light-diffusing particles. The component may also have a transparent encapsulation with light-diffusing particles.

In accordance with again an added feature of the invention, the luminescence conversion element comprises at least one luminescent 4f-organometallic compound.

A blue output radiation is obtained if, in accordance with the invention, the luminescence conversion element includes a luminescent material that is luminescent in a blue region. The encapsulation may thereby be transparent with a blue luminescent material.

As noted, the luminescence conversion encapsulation or the luminescence conversion layer may be produced from a resist or from a plastic, for example from a silicone, thermoplastic or thermosetting plastic material (epoxy and acrylate resins) used for the encapsulation of optoelectronic components. Furthermore, covering elements fabricated from thermoplastic materials, for example, can be used as the luminescence conversion encapsulation. All the above-mentioned materials can be treated with one or more luminescent materials in a simple manner.

A semiconductor component according to the invention can be realized in a particularly simple manner when the semiconductor body is arranged in a recess in an optionally prefabricated housing and the recess is provided with a covering element having the luminescence conversion layer. A semiconductor component of this type can be produced in large numbers in conventional production lines. For this purpose, all that is necessary, after the mounting of the semiconductor body in the housing, is to apply the covering element, for example a resist or casting resin layer or a prefabricated covering plate made of thermoplastic material, to the housing. Optionally, the recess in the housing may be filled with a transparent material, for example a transparent plastic, which does not alter in particular the wavelength of the light emitted by the semiconductor body or, however, if desired, may already be designed such that it effects luminescence conversion.

In a development of the semiconductor component according to the invention which is particularly preferred on account of the fact that it can be realized in a particularly simple manner, the semiconductor body is arranged in a recess in a housing which is optionally prefabricated and may already be provided with a lead frame and the recess is filled with an at least partially transparent casting resin, to which the luminescent material has already been added prior to the recess being sealed by casting. In this case, the luminescence conversion element is consequently provided by the potting of the semiconductor body that is provided with luminescent material.

A particularly preferred material for the production of the luminescence conversion element is epoxy resin, to which one or more luminescent materials are added. However, it is also possible to use polymethyl methacrylate (PMMA) instead of epoxy resin.

PMMA can be treated with organic dye molecules in a simple manner. Perylene-based dye molecules, for example, can be used to produce green-, yellow- and red-light-emitting semiconductor components according to the invention. Semiconductor components which emit light in the UV, visible or infrared region can also be produced by admixture of 4f-organometallic compounds. In particular, red-light-emitting semiconductor components according to the invention can be realized for example by admixture of $Eu^{3+}$-based organometallic chelates ($\lambda \approx 620$ nm). Infrared-radiating semiconductor components according to the invention, in particular having blue-light-emitting semiconductor bodies, can be produced by admixture of 4f-chelates or of $Ti^{3+}$-doped sapphire.

A white-light-radiating semiconductor component according to the invention can advantageously be produced by choosing the luminescent material such that a blue radiation emitted by the semiconductor body is converted into complementary wavelength ranges, in particular blue and yellow, or to form additive color triads, for example blue, green and red. In this case, the yellow or the green and red light is produced by means of the luminescent materials. The hue (color locus in the CIE chromaticity diagram) of the white light thereby produced can in this case be varied by a suitable choice of the dye/s in respect of mixture and concentration.

Suitable organic luminescent materials for a white-light-radiating semiconductor component according to the invention are perylene luminescent materials, such as, for example, BASF Lumogen F 083 for green luminescence, BASF Lumogen F 240 for yellow luminescence and BASF Lumogen F 300 for red luminescence. These dyes can be added to transparent epoxy resin, for example, in a simple manner.

A preferred method for producing a green-light-emitting semiconductor component using a blue-light-radiating semiconductor body consists in using $UO_2^{++}$-substituted borosilicate glass for the luminescence conversion element.

In a further preferred development of a semiconductor component according to the invention and of the advantageous embodiments specified above, light-diffusing particles, so-called diffusers, are additionally added to the luminescence conversion element or to another radiation-transmissive component of the component encapsulation. The color perception and the radiation characteristics of the semiconductor component can advantageously be optimized by this means.

In a particularly advantageous embodiment of the semiconductor component according to the invention, the luminescence conversion element is at least partially composed of a transparent epoxy resin provided with an inorganic luminescent material. Specifically, it is advantageous that inorganic luminescent materials can be bound in epoxy resin in a simple manner. A particularly preferred inorganic luminescent material for the production of white-light-emitting semiconductor components according to the invention is the phosphor YAG:Ce ($Y_3Al_5O_{12}:Ce^{3+}$). The latter can be mixed in a particularly simple manner in transparent epoxy resins which are conventionally used in LED technology. Other conceivable luminescent materials are further garnets doped with rare earths, such as, for example, $Y_3Ga_5O_{12}:Ce^{3+}$, $Y(Al,Ga)_5O_{12}:Ce^{3+}$ and $Y(Al,Ga)_5O_{12}:Tb^{3+}$, as well as alkaline earth metal sulfides doped with rare earths, such as, for example, $SrS:Ce^{3+}$, Na, $SrS:Ce^{3+}$, Cl, $Srs:CeCl_3$, $CaS:Ce^{3+}$ and $SrSe:Ce^{3+}$.

Furthermore, the thiogallates doped with rare earths, such as, for example, $CaGa_2S_4:Ce^{3+}$ and $SrGa_2S_4:Ce^{3+}$, are particularly suitable for the purpose of producing differently polychromatic light. The use of aluminates doped with rare earths, such as, for example, $YAlO_3:Ce^{3+}$, $YGaO_3:Ce^{3+}$, $Y(Al,Ga)O_3:Ce^{3+}$, and orthosilicates $M_2SiO_5:Ce^{3+}$ (M:Sc, Y, Sc) doped with rare earths, such as, for example, $Y_2SiO_5:Ce^{3+}$, is likewise conceivable for this purpose. In all of the yttrium compounds, the yttrium can, in principle, also be replaced by scandium or lanthanum.

In a further possible embodiment of the semiconductor component according to the invention, at least all those components of the encapsulation through which light is radiated, that is to say including the luminescence conversion encapsulation or layer, are composed of purely inorganic materials. Consequently, the luminescence conversion element is composed of an inorganic luminescent material which is embedded in a thermally stable, transparent or partially transparent inorganic material. In particular, the luminescence conversion element is composed of an inorganic phosphor, which is embedded in an inorganic glass advantageously of low melting point (for example silicate glass). A preferred procedure for producing a luminescence conversion layer of this type is the sol gel technique, by means of which the entire luminescence conversion layer, hat is to say both the inorganic luminescent material and the embedding material, can be produced in one work operation.

In order to improve the thorough mixing of the radiation of the first wavelength range that is emitted by the semiconductor body with the luminescence-converted radiation of the second wavelength range and hence the color homogeneity of the radiated light, in an advantageous refinement of the semiconductor component according to the invention, a dye which emits light in the blue region is additionally added to the luminescence encapsulation or the luminescence conversion layer and/or to another component of the component encapsulation, which dye attenuates a so-called directional characteristic of the radiation radiated by the semiconductor body. Directional characteristic is to be understood to mean that the radiation emitted by the semiconductor body has a preferred radiation direction.

In a preferred refinement of the semiconductor component according to the invention, the inorganic luminescent material is used in powder form for the above-mentioned purpose of thorough mixing of the emitted radiation, the luminescent material particles not dissolving in the substance (matrix) encapsulating them. In addition, the inorganic luminescent material and the substance encapsulating it have mutually different refractive indices. This advantageously leads to a portion of the light which is not absorbed by the luminescent material being scattered, in a manner dependent on the particle size of the luminescent material. The directional characteristic of the radiation radiated by the semiconductor body is thereby efficiently attenuated, with the result that the unabsorbed radiation and the luminescence-converted radiation are homogeneously mixed, which leads to a spatially homogeneous color perception.

A white-light-radiating semiconductor component according to the invention can particularly preferably be realized by admixing the inorganic luminescent material YAG:Ce ($Y_3Al_5O_{12}:Ce^{3+}$) with an epoxy resin used to produce the luminescence conversion encapsulation or layer. Part of a blue radiation emitted by the semiconductor body is shifted by the inorganic luminescent material $Y_3Al_5O_{12}:Ce^{3+}$ into the yellow spectral region and, consequently, into a wavelength range which is complementarily colored with respect to the color blue. The hue (color locus in the CIE chromaticity diagram) of the white light can in this case be varied by a suitable choice of the dye mixture and concentration.

The inorganic luminescent material YAG:Ce has, inter alia, the particular advantage that insoluble coloring pigments (particle size in the region of 10 nm) having a refractive index of approximately 1.84 are involved in this case. Consequently, not only does the wavelength conversion occur but also a scattering effect which leads to good mixing together of blue diode radiation and yellow converter radiation.

In a further preferred development of a semiconductor component according to the invention and of the advantageous embodiments specified above, light-diffusing particles, so-called diffusers, are additionally added to the luminescence conversion element or to another radiation-transmissive component of the component encapsulation. The color perception and the radiation characteristic of the semiconductor component can advantageously be further improved by this means.

It is particularly advantageous that the luminous efficiency of white-light-emitting semiconductor components according to the invention and their above-mentioned embodiments having a blue-light-emitting semiconductor body produced essentially on the basis of GaN is comparable with the luminous efficiency of an incandescent bulb. The reason for this is that, on the one hand, the external quantum efficiency of such semiconductor bodies is a few percent and, on the other hand, the luminescence efficiency of organic dye molecules is often established at more than 90%. Furthermore, the semiconductor component according to the invention is distinguished by an extremely long life, greater robustness and a smaller operating voltage in comparison with the incandescent bulb.

It is advantageous, moreover, that the luminosity of the semiconductor component according to the invention that is perceptible to the human eye can be distinctly increased by comparison with a semiconductor component which is not equipped with the luminescence conversion element but is otherwise identical, since the sensitivity of the eye increases in the direction of a higher wavelength.

Furthermore, the principle according to the invention can advantageously be used also to convert an ultraviolet radiation which is emitted by the semiconductor body in addition to the visible radiation into visible light. The luminosity of the light emitted by the semiconductor body is thereby distinctly increased.

The concept, presented here, of luminescence conversion with blue light from a semiconductor body can advantageously be extended to multistage luminescence conversion elements as well, in accordance with the scheme ultraviolet→blue→green→yellow→red. In this case, a plurality of spectrally selectively emitting luminescence conversion elements are arranged one after the other relative to the semiconductor body.

Likewise, it is advantageously possible for a plurality of differently spectrally selectively emitting dye molecules to be jointly embedded in a transparent plastic of a luminescence conversion element. A very broad color spectrum can be produced by this means.

A particular advantage of white-light-radiating semiconductor components according to the invention in which YAG:Ce, in particular, is used as the luminescence conversion dye consists in the fact that this luminescent material, upon excitation by blue light, effects a spectral shift of approximately 100 nm between absorption and emission. This leads to a significant reduction in the reabsorption of the light emitted by the luminescent material and hence to a higher luminous efficiency. In addition, YAG:Ce advantageously has high thermal and photochemical (for example UV) stability (significantly higher than organic luminescent materials), with the result that it is even possible to produce white-light-emitting diodes for outdoor use and/or high temperature ranges.

YAG:Ce has, to date, proved to be the best-suited luminescent material in respect of reabsorption, luminous efficiency, thermal and photochemical stability and processability. However, the use of other Ce-doped phosphors is also conceivable, in particular of Ce-doped garnets.

In a particularly advantageous manner, semiconductor components according to the invention can be used, in particular on account of their low power consumption, in full-color LED displays for the lighting of motor vehicle interiors or of aircraft cabins as well as for the illumination of display devices such as motor vehicle dashboards or liquid crystal displays.

Other features which are considered as characteristic for the invention are set forth in the appended claims.

Although the invention is illustrated and described herein as embodied in a light-radiating semiconductor component having a luminescence conversion element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a diagrammatic sectional side view of a fourth exemplary embodiment of the semiconductor component according to the invention;

FIG. 5 is a diagrammatic sectional side view of a fifth exemplary embodiment of the semiconductor component according to the invention;

FIG. 6 is a diagrammatic sectional side view of a sixth exemplary embodiment of the semiconductor component according to the invention;

FIG. 7 is a graph of an emission spectrum of a blue-light-radiating semiconductor body with a layer sequence based on GaN;

FIG. 8 is a graph of the emission spectra of two semiconductor components according to the invention which radiate white light;

FIG. 9 is a diagrammatic sectional view taken through a semiconductor body which emits blue light;

FIG. 10 is a diagrammatic sectional side view of a seventh exemplary embodiment of the semiconductor component according to the invention;

DESCRIPTION OF THE PREFERRED EMBODIMENTS

Figure 1:
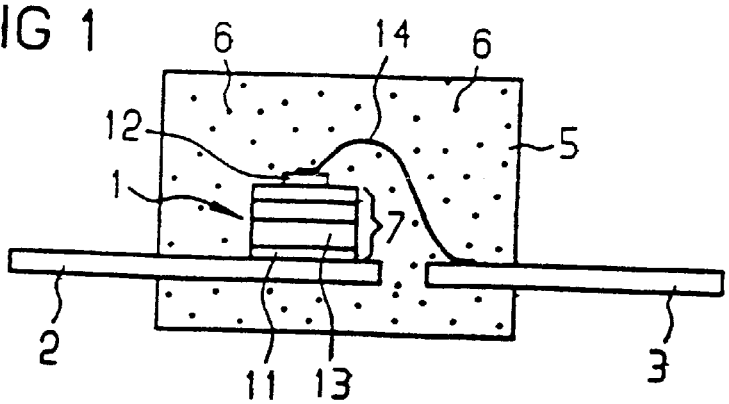
FIG. 1 is a diagrammatic sectional side view of a first exemplary embodiment of a semiconductor component according to the invention.

Reference will now be had to the figures of the drawing in detail, in which identical or functionally identical parts are designated by the same reference symbols throughout, and first, particularly, to FIG. 1 thereof.

The light-emitting semiconductor component illustrated in FIG. 1, a semiconductor body 1 has a back-side contact 11, a front-side contact 12 and a layer sequence 7, which is composed of a number of different layers and has at least one active zone which emits a radiation (for example ultraviolet, blue or green) during the operation of the semiconductor component.

An example of a suitable layer sequence 7 for this and for all of the exemplary embodiments described below is shown in FIG. 9. There, a layer sequence made of an AlN or GaN layer 19, an n-conducting GaN layer 20, an n-conducting $Ga_xAl_{1-x}N$ or $Ga_xIn_{1-x}N$ layer 21, a further n-conducting GaN or a $Ga_xIn_{1-x}N$ layer 22, a p-conducting $Ga_xAl_{1-x}N$ layer or $Ga_xIn_{1-x}N$ layer 23 and a p-conducting GaN layer 24 is applied on a substrate 18 composed of SiC, for example. A respective contact metallization layer 27, 28 is applied on a main surface 25 of the p-conducting GaN layer 24 and a main surface 26 of the substrate 18, said contact metallization layer being composed of a material which is conventionally used for electrical contacts in opto-semiconductor technology.

However, it is also possible to use any other semiconductor body deemed to be suitable by those skilled in this art for the semiconductor component according to the invention. This likewise applies to all of the exemplary embodiments described below.

In the exemplary embodiment of FIG. 1, the semiconductor body 1 is fixed by its back-side contact 11 on a first electrical terminal 2 by means of an electrically conductive bonding agent, for example a metallic solder of an adhesive. The front-side contact 12 is connected to a second electrical terminal 3 by means of a bonding wire 14.

The free surfaces of the semiconductor body 1 and partial regions of the electrical terminals 2 and 3 are directly enclosed by a luminescence conversion encapsulation 5. The latter is preferably composed of a transparent plastic (preferably epoxy resin or else polymethyl methacrylate) which can be used for transparent light-emitting diode encapsulations and is treated with luminescent material 6, preferably inorganic luminescent material, for white-light-emitting components, preferably $Y_3Al_5O_{12}:Ce^{3+}$ (YAG:Ce).

Figure 2:
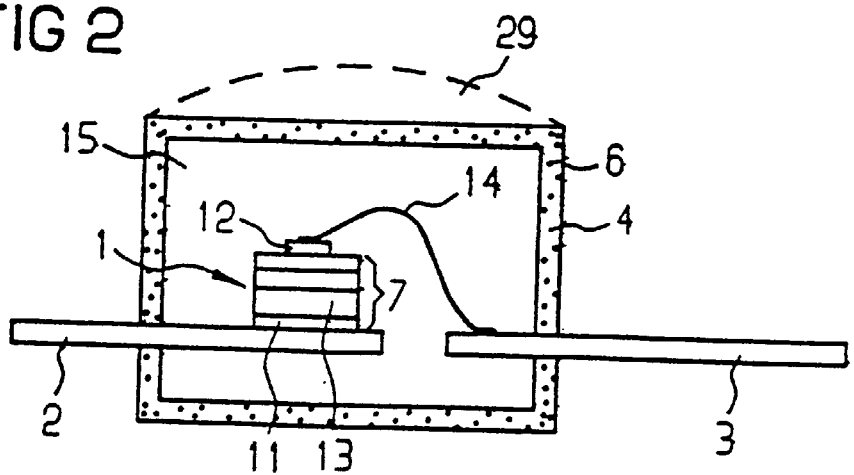
FIG. 2 is a diagrammatic sectional side view of a second exemplary embodiment of the semiconductor component according to the invention.

The exemplary embodiment of a semiconductor component according to the invention which is illustrated in FIG. 2 differs from that of FIG. 1 by the fact that the semiconductor body 1 and partial regions of the electrical terminals 2 and 3 are enclosed by a transparent encapsulation 15 instead of by a luminescence conversion encapsulation. This transparent encapsulation 15 does not effect any wavelength change in the radiation emitted by the semiconductor body 1 and is composed, for example, of an epoxy, silicone or acrylate resin which is conventionally used in light-emitting diode technology, or of another suitable radiation-transmissive material, such as inorganic glass, for example.

A luminescence conversion layer 4 is applied to the transparent encapsulation 15 and, as illustrated in FIG. 2, covers the entire surface of the encapsulation 15. It is likewise conceivable for the luminescence conversion layer 4 to cover only a partial region of this surface. The luminescence conversion layer 4 is composed, for example, once again of a transparent plastic (for example epoxy resin, resist or polymethyl methacrylate) which is treated with a luminescent material 6. In this case, too, YAG:Ce is preferably suitable as luminescent material for a white-light-emitting semiconductor component.

This exemplary embodiment has the particular advantage that the path length through the luminescence conversion element is approximately the same size for all of the radiation emitted by the semiconductor body. This is important particularly when, as is often the case, the exact hue of the light radiated by the semiconductor component depends on this path length.

For improved output coupling of the light from the luminescence conversion layer 4 of FIG. 2, a covering 29 (depicted by a broken line) in the form of a lens can be provided on a side surface of the component, which covering reduces total reflection of the radiation within the luminescence conversion layer 4. This covering 29 in the form of a lens may be composed of transparent plastic or glass and be bonded, for example, onto the luminescence conversion layer 4 or be designed directly as the component part of the luminescence conversion layer 4.

Figure 3:
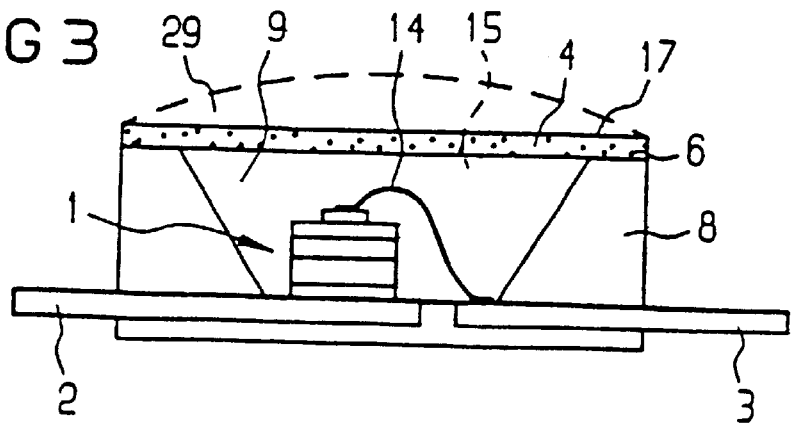
FIG. 3 is a diagrammatic sectional side view of a third exemplary embodiment of the semiconductor component according to the invention.

In the exemplary embodiment illustrated in FIG. 3, the first and second electrical terminals 2, 3 are embedded in an opaque, possibly prefabricated base housing 8 having a recess 9. "Prefabricated" is to be understood to mean that the base housing 8 is already preconstructed on the connections 2, 3, for example by means of injection molding, before the semiconductor body is mounted on to the connection 2. The base housing 8 is composed for example of an opaque plastic and the recess 9 is designed, in respect of its shape, as a reflector 17 for the radiation emitted by the semiconductor body during operation (if appropriate by suitable coating of the inner walls of the recess 9). Such base housings 8 are used in particular in the case of light-emitting diodes which can be surface-mounted on printed circuit boards. They are applied to a lead frame having the electrical terminals 2, 3, for example by means of injection molding, prior to the mounting of the semiconductor bodies.

The recess 9 is covered by a luminescence conversion layer 4, for example a separately produced covering plate 17 made of plastic which is fixed on the base housing 8. Suitable materials for the luminescence conversion layer 4 are once again, as mentioned further above in the general part of the description, the plastics or inorganic glass in conjunction with the luminescent materials mentioned there. The recess 9 may either be filled with a transparent plastic, with an inorganic glass or with gas or else be provided with a vacuum.

As in the case of the exemplary embodiment according to FIG. 2, a covering 29 (depicted by a broken line) in the form of a lens can be provided on the luminescence conversion layer 4 in this case as well, for improved output coupling of the light from said luminescence conversion layer, which covering reduces total reflection of the radiation within the luminescence conversion layer 4. This covering 29 may be composed of transparent plastic and be bonded, for example, onto the luminescence conversion layer 4 or be designed integrally together with the luminescence conversion layer 4.

Figure 13:
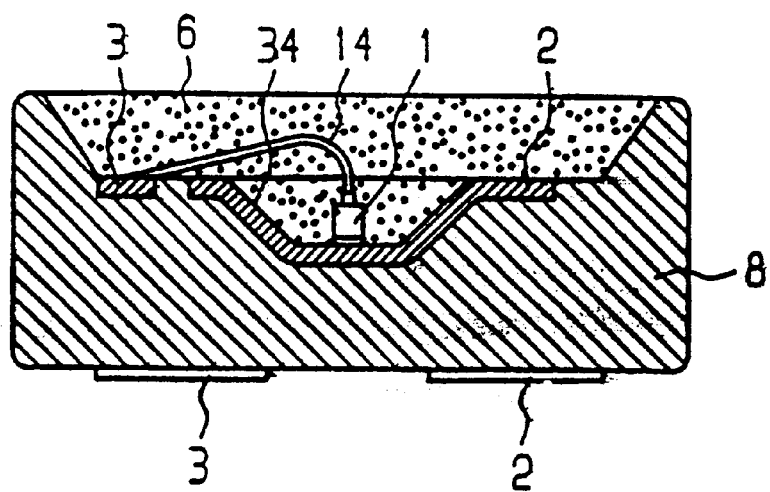
FIG. 13 is a diagrammatic sectional side view of an eighth exemplary embodiment of the semiconductor component according to the invention.

In a particularly preferred embodiment, the recess 9 is filled, as shown in FIG. 10, with an epoxy resin provided with luminescent material, that is to say with a luminescence encapsulation 5 which forms the luminescence conversion element. A covering plate 17 and/or a covering 29 in the form of a lens can then be omitted as well. Furthermore, as illustrated in FIG. 13, the first electrical terminal 2 is optionally designed as a reflector well 34 for example by embossing in the region of the semiconductor body 1, which reflector well is filled with a luminescence conversion encapsulation 5.

In FIG. 4, a so-called radial diode is illustrated as a further exemplary embodiment. In this case, the semiconductor body 1 is fixed in a part 16, designed as a reflector, of the first electrical terminal 2 by means of soldering or bonding, for example. Such housing designs are known in light-emitting diode technology and, therefore, need not be explained in any further detail.

In the exemplary embodiment of FIG. 4, the semiconductor body 1 is surrounded by a transparent encapsulation 15 which, as in the case of the second exemplary embodiment mentioned (FIG. 2), does not effect any wavelength change in the radiation emitted by the semiconductor body 1 and may be composed, for example, of a transparent epoxy resin which is conventionally used in light-emitting diode technology or of organic glass.

A luminescence conversion layer 4 is applied on this transparent encapsulation 15. Suitable materials for this are, for example, once again, as referred to in connection with the above-mentioned exemplary embodiments, the plastics or inorganic glass in conjunction with the dyes mentioned there.

The entire structure, comprising semiconductor body 1, partial regions of the electrical terminals 2, 3, transparent encapsulation 15 and luminescence conversion layer 4, is directly enclosed by a further transparent encapsulation 10, which does not effect any wavelength change in the radiation which has passed through the luminescence conversion layer 4. It is composed, for example, once again of a transparent epoxy resin which is conventionally used in light-emitting diode technology or of inorganic glass.

The exemplary embodiment shown in FIG. 5 differs from that of FIG. 4 essentially by the fact that the free surfaces of the semiconductor body 1 are directly covered by a luminescence conversion encapsulation 5, which is again surrounded by a further transparent encapsulation 10. FIG. 5 illustrates, moreover, by way of example, a semiconductor body 1 in which, instead of the underside contacts, a further contact is provided on the semiconductor layer sequence 7, which further contact is connected to the associated electrical terminal 2 or 3 by means of a second bonding wire 14. It goes without saying that such semiconductor bodies 1 can also be used in all the other exemplary embodiments described herein. Conversely, of course, a semiconductor body 1 in accordance with the above-mentioned exemplary embodiments can also be used in the exemplary embodiment of FIG. 5.

For the sake of completeness, let it be noted at this point that an integral luminescence conversion encapsulation 5, which then replaces the combination of luminescence conversion encapsulation 5 and further transparent encapsulation 10, can, of course, also be used in the design according to FIG. 5 in an analogous manner to the exemplary embodiment according to FIG. 1.

In the case of the exemplary embodiment of FIG. 6, a luminescence conversion layer 4 (possible materials as specified above) is applied directly to the semiconductor body 1. The latter and partial regions of the electrical terminals 2, 3 are enclosed by a further transparent encapsulation 10, which does not effect any wavelength change in the radiation which has passed through the luminescence conversion layer 4, and is fabricated for example from a transparent epoxy resin which can be used in light-emitting diode technology or from glass.

Such semiconductor bodies 1 provided with a luminescence conversion layer 4 and not having an encapsulation can, of course, advantageously be used in all housing designs known from light-emitting diode technology (for example SMD housings, radial housings (cf. FIG. 5)).

Figure 14:
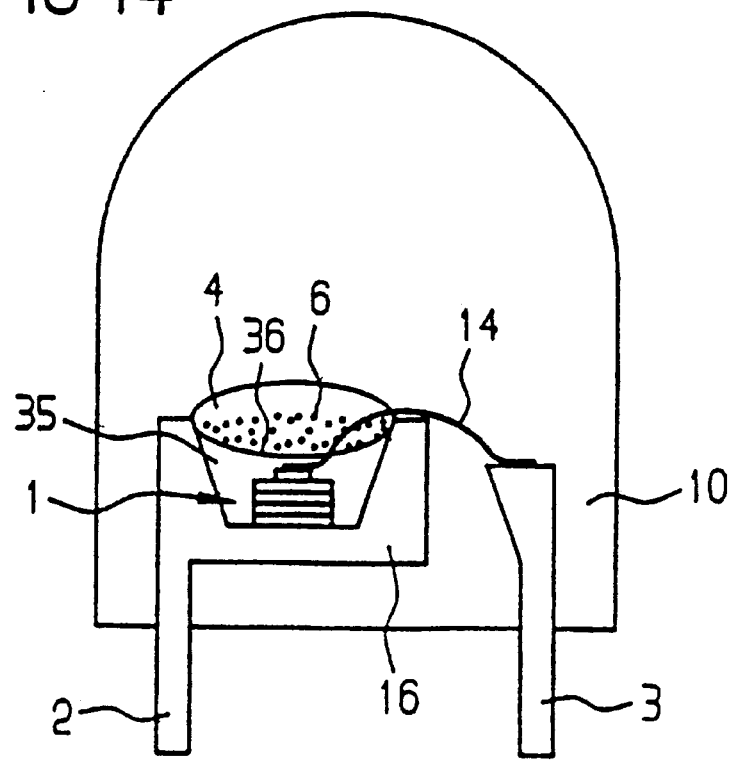
FIG. 14 is a diagrammatic sectional side view of a ninth exemplary embodiment of the semiconductor component according to the invention.

In the case of the exemplary embodiment of a semiconductor component according to the invention which is illustrated in FIG. 14, a transparent well part 35 is arranged on the semiconductor body 1 and has a well 36 above the semiconductor body 1. The well part 35 is composed for example of transparent epoxy resin or of inorganic glass and is fabricated for example by means of injection-molding encapsulation of the electrical terminals 2, 3 including semiconductor body 1. Arranged in this well 36 is a luminescence conversion layer 4, which, for example, is once again fabricated from epoxy resin or inorganic glass in which are bound particles 37, composed of one of the above-mentioned inorganic luminescent materials. In the case of this design, it is advantageously ensured in a very simple manner that the luminescent material accumulates at unintended locations, for example next to the semiconductor body, during the production of the semiconductor component. Of course, the well part 35 can also be produced separately and be fixed in a different way, for example on a housing part, above the semiconductor body 1.

In all of the exemplary embodiments described above, it is possible, in order to optimize the color perception of the radiated light and also in order to adapt the radiation characteristic, for the luminescence conversion element (luminescence conversion encapsulation 5 or luminescence conversion layer 4), if appropriate the transparent encapsulation 15, and/or if appropriate the further transparent encapsulation 10 to have light-diffusing particles, advantageously so-called diffusers. Examples of such diffusers are mineral fillers, in particular $CaF_2$, $TiO_2$, $SiO_2$, $CaCO_3$ or $BaSO_4$ or else organic pigments. These materials can be added in a simple manner to the above-mentioned plastics.

Figure 12:
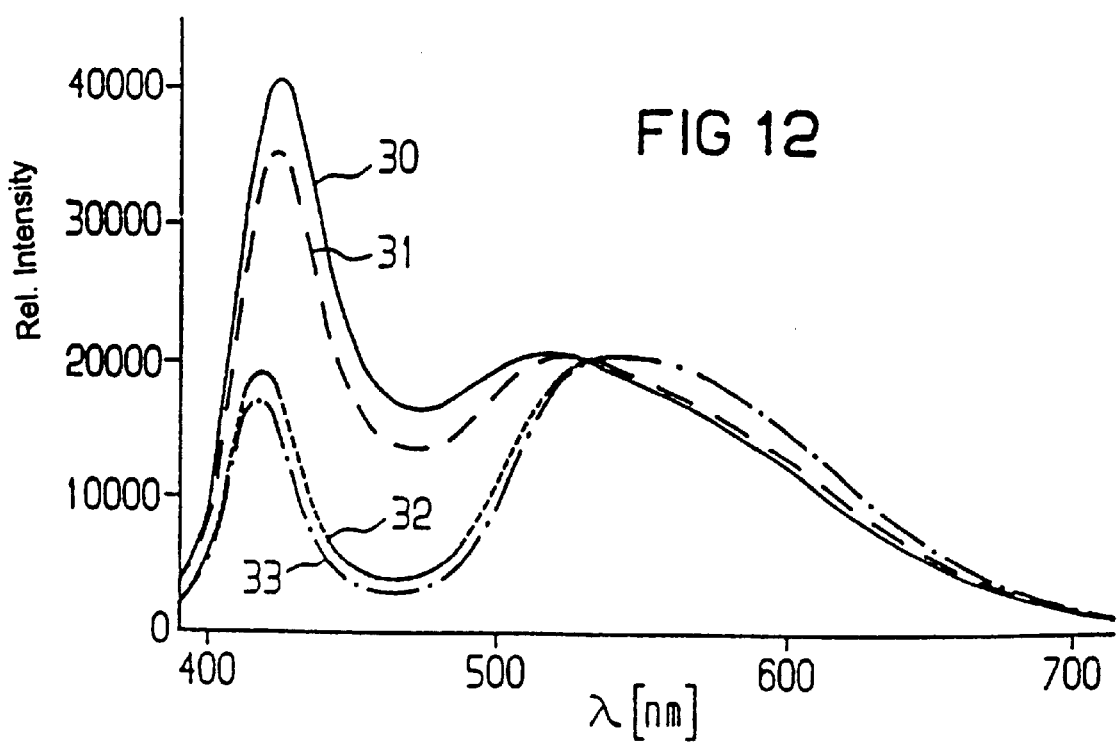
FIG. 12 is a graph of the emission spectra of further semiconductor components according to the invention which radiate white light.

FIGS. 7, 8 and 12 respectively show emission spectra of a blue-light-radiating semiconductor body (FIG. 7) (luminescence maximum at $\lambda \approx 430$ nm) and of white-light-emitting semiconductor components according to the invention which are produced by means of such a semiconductor body (FIGS. 8 and 12). The wavelength l in nm is plotted in each case on the abscissa and a relative electroluminescence (EL) intensity is in each case plotted on the ordinate.

Only part of the radiation emitted by the semiconductor body according to FIG. 7 is converted into a wavelength range of longer wavelength, with the result that white light is produced as mixed color. The dashed line 30 in FIG. 8 represents an emission spectrum of a semiconductor component according to the invention which emits radiation from two complementary wavelength ranges (blue and yellow) and hence white light overall. In this case, the emission spectrum has a respective maximum at wavelengths of between approximately 400 and approximately 430 nm (blue) and of between approximately 550 and approximately 580 nm (yellow). The solid line 31 represents the emission spectrum of a semiconductor component according to the invention which mixes the color white from three wavelength ranges (additive color triad formed from blue, green and red). In this case, the emission spectrum has a respective maximum for example at the wavelengths of approximately 430 nm (blue), approximately 500 nm (green) and approximately 615 nm (red).

Figure 11:
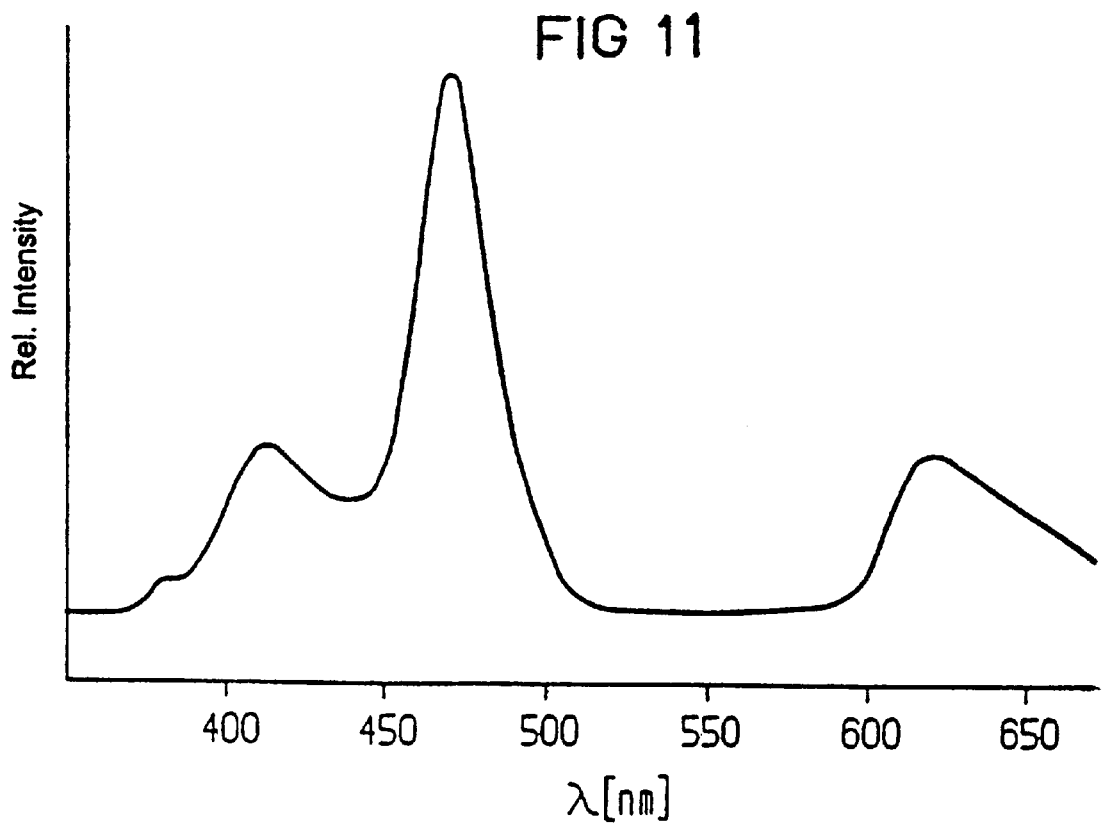
FIG. 11 is a graph of an emission spectrum of a semiconductor component according to the invention which radiates polychromatic red light.

Furthermore, FIG. 11 illustrates an emission spectrum of a semiconductor component according to the invention which radiates polychromatic light comprising blue light (maximum at a wavelength of approximately 470 nm) and red light (maximum at a wavelength of approximately 620 nm). The overall color perception of the radiated light for the human eye is magenta. The emission spectrum radiated by the semiconductor body in this case corresponds once again to that of FIG. 7.

FIG. 12 shows a white-light-emitting semiconductor component according to the invention which is provided with a semiconductor body emitting an emission spectrum in accordance with FIG. 7 and in which YAG:Ce is used as the luminescence material. Only part of the radiation emitted by the semiconductor body in accordance with FIG. 7 is converted into a wavelength range of longer wavelength, with the result that white light is produced as the mixed color. The differently dashed lines 30 to 33 of FIG. 12 represent emission spectra of semiconductor components according to the invention in which the luminescence conversion element, in this case a luminescence conversion encapsulation made of epoxy resin, has different YAG:Ce concentrations. Each emission spectrum has a respective intensity maximum between $\lambda=420$ nm and $\lambda=430$ nm, that is to say in the blue spectral region and between $\lambda=520$ nm and $\lambda=545$ nm, that is to say in the green spectral region, the emission bands having the longer-wavelength intensity maximum largely lying in the yellow spectral region. The diagram of FIG. 12 makes it clear that in the semiconductor component according to the invention, the CIE color locus of the white light can be altered in a simple manner by alteration of the luminescent material concentration in the epoxy resin.

Furthermore, it is possible to apply inorganic luminescent materials based on Ce-doped garnets, thiogallates, alkaline earth metal sulfides and aluminates directly to the semiconductor body, without dispersing them in epoxy resin or glass.

A further particular advantage of the above-mentioned inorganic luminescent materials results from the fact that, unlike in the case of organic dyes, the luminescent material concentration e.g. in the epoxy resin is not limited by the solubility. As a result, large thicknesses of luminescence conversion elements are not necessary.

The explanation of the semiconductor component according to the invention using the exemplary embodiments described above ought not, of course, to be regarded as a restriction of the invention thereto. For example, a polymer LED emitting a corresponding radiation spectrum may also be understood as semiconductor body, such as, for example, light-emitting diode chips or laser diode chips.

We claim:

1. A light-radiating semiconductor component, comprising:
    a semiconductor body emitting electromagnetic radiation during an operation of the semiconductor component, said semiconductor body having a semiconductor layer sequence suitable for emitting electromagnetic radiation of a first wavelength range selected from a spectral region consisting of ultraviolet, blue, and green;
    a first electrical terminal and a second electrical terminal each electrically conductively connected to said semiconductor body;
    a luminescence conversion element with at least one luminescent material, said luminescence conversion element being deposited on said semiconductor body, said luminescence conversion element converting a radiation originating in the first wavelength range into radiation of a second wavelength range different from the first wavelength range, such that the semiconductor component emits polychromatic visible light comprising radiation of the first wavelength range and radiation of the second wavelength range; and
    said luminescence conversion element being formed such that the radiation of the first wavelength range passes through said luminescence conversion element along a plurality of paths, the plurality of paths having a substantially equal path length inside said luminescence conversion element, and said luminescence conversion element emitting a substantial portion of the radiation of the first wavelength range and the radiation of the second wavelength range,
    wherein said luminescence conversion element comprises a plurality of layers with mutually different wavelength conversion properties.

2. A light-radiating semiconductor component, comprising:
    a semiconductor body emitting electromagnetic radiation during an operation of the semiconductor component, said semiconductor body having a semiconductor layer sequence suitable for emitting electromagnetic radiation of a first wavelength range selected from a spectral region consisting of ultraviolet, blue, and green;
    a first electrical terminal and a second electrical terminal each electrically conductively connected to said semiconductor body;
    a luminescence conversion element with at least one luminescent material, said luminescence conversion element being deposited on said semiconductor body, said luminescence conversion element converting a radiation originating in the first wavelength range into radiation of a second wavelength range different from the first wavelength range, such that the semiconductor component emits polychromatic visible light comprising radiation of the first wavelength range and radiation of the second wavelength range; and
    said luminescence conversion element being formed such that the radiation of the first wavelength range passes through said luminescence conversion element along a plurality of paths, the plurality of paths having a substantially equal path length inside said luminescence conversion element, and said luminescence conversion element emitting a substantial portion of the radiation of the first wavelength range and the radiation of the second wavelength range,
    wherein said luminescence conversion element includes light-diffusing particles.

3. A light-radiating semiconductor component, comprising:
    a semiconductor body emitting electromagnetic radiation during an operation of the semiconductor component, said semiconductor body having a semiconductor layer sequence suitable for emitting electromagnetic radiation of a first wavelength range selected from a spectral region consisting of ultraviolet, blue, and green;

a first electrical terminal and a second electrical terminal each electrically conductively connected to said semiconductor body;

a luminescence conversion element with at least one luminescent material, said luminescence conversion element being deposited on said semiconductor body, said luminescence conversion element converting a radiation originating in the first wavelength range into radiation of a second wavelength range different from the first wavelength range, such that the semiconductor component emits polychromatic visible light comprising radiation of the first wavelength range and radiation of the second wavelength range; and said luminescence conversion element being formed such that the radiation of the first wavelength range passes through said luminescence conversion element along a plurality of paths, the plurality of paths having a substantially equal path length inside said luminescence conversion element, and said luminescence conversion element emitting a substantial portion of the radiation of the first wavelength range and the radiation of the second wavelength range, which comprises a transparent encapsulation with light-diffusing particles.

4. A light-radiating semiconductor component, comprising:

a semiconductor body emitting electromagnetic radiation during an operation of the semiconductor component, said semiconductor body having a semiconductor layer sequence suitable for emitting electromagnetic radiation of a first wavelength range selected from a spectral region consisting of ultraviolet, blue, and green;

a first electrical terminal and a second electrical terminal each electrically conductively connected to said semiconductor body;

a luminescence conversion element with at least one luminescent material, said luminescence conversion element being deposited on said semiconductor body, said luminescence conversion element converting a radiation originating in the first wavelength range into radiation of a second wavelength range different from the first wavelength range, such that the semiconductor component emits polychromatic visible light comprising radiation of the first wavelength range and radiation of the second wavelength range; and said luminescence conversion element being formed such that the radiation of the first wavelength range passes through said luminescence conversion element along a plurality of paths, the plurality of paths having a substantially equal path length inside said luminescence conversion element, and said luminescence conversion element emitting a substantial portion of the radiation of the first wavelength range and the radiation of the second wavelength range, wherein said luminescence conversion element is directly deposited on said semiconductor body.

* * * * *